United States Patent
Son

(10) Patent No.: US 8,050,112 B2
(45) Date of Patent: Nov. 1, 2011

(54) INTERNAL VOLTAGE GENERATION CIRCUIT

(75) Inventor: Jong Ho Son, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 314 days.

(21) Appl. No.: 12/459,363

(22) Filed: Jun. 29, 2009

(65) Prior Publication Data

US 2010/0085829 A1 Apr. 8, 2010

(30) Foreign Application Priority Data

Oct. 2, 2008 (KR) .................. 10-2008-0097388

(51) Int. Cl.
*G11C 5/14* (2006.01)

(52) U.S. Cl. ......... 365/189.09; 365/189.05; 365/189.11; 365/189.07

(58) Field of Classification Search ............ 365/189.09, 365/189.05, 189.07, 189.11
See application file for complete search history.

(56) References Cited

U.S. PATENT DOCUMENTS

| | | | | |
|---|---|---|---|---|
| 5,396,116 A | * | 3/1995 | Watanabe et al. | 365/227 |
| 5,691,661 A | * | 11/1997 | Fukuda et al. | 365/222 |
| 7,940,112 B2 | * | 5/2011 | Okuno et al. | 365/226 |
| 7,953,573 B2 | * | 5/2011 | Walker | 365/189.09 |
| 2009/0027105 A1 | | 1/2009 | Son | |
| 2009/0091376 A1 | | 4/2009 | Kim et al. | |
| 2010/0061172 A1 | * | 3/2010 | Chen | 365/211 |
| 2010/0195414 A1 | * | 8/2010 | Kim et al. | 365/189.07 |

FOREIGN PATENT DOCUMENTS

| | | |
|---|---|---|
| KR | 10-2007-0024068 A | 3/2007 |
| KR | 10-2007-0080883 A | 8/2007 |

* cited by examiner

*Primary Examiner* — Tuan T. Nguyen
(74) *Attorney, Agent, or Firm* — John P. White; Cooper & Dunham LLP

(57) ABSTRACT

An internal voltage generation circuit includes a temperature detection unit which detects an internal temperature of a semiconductor memory device and generates a temperature signal, a driving control signal generation unit which receives the temperature signal and generates first and second driving control signals, and an internal voltage generation unit which receives the first and second driving control signals and generates an internal voltage.

24 Claims, 7 Drawing Sheets

INTERNAL VOLTAGE GENERATION CIRCUIT

TECHNICAL FIELD

This disclosure relates to a semiconductor memory device, and more particularly, to an internal voltage generation circuit capable of increasing an internal voltage driving force according to a temperature.

BACKGROUND

In general, a memory device receives a power voltage (VDD) and a ground voltage (VSS) from the outside, and generates and uses an internal voltage required for internal operation. A voltage required for internal operation of the semiconductor memory device includes an internal power (VCORE) supplied to a memory core region, a high voltage (Vpp) used upon driving of a word line or overdriving and a back bias voltage (VBB) supplied as a bulk voltage of an NMOS transistor in the core region.

Also, the internal voltage includes a cell plate voltage (VCP) used as a plate voltage of a memory cell capacitor and a bit line precharge voltage (VBLP) used to precharge a bit line. In general, the cell plate voltage (VCP) and the bit line precharge voltage (VBLP) are generated from the internal power (VCORE) and are generated to a half level of the internal power (VCORE) to minimize current consumption.

FIG. 1 is a circuit diagram illustrating a conventional internal voltage generation circuit.

As illustrated, the conventional internal voltage generation circuit is a circuit for generating a cell plate voltage VCP or a bit line precharge voltage VBLP, and voltage-divides the internal power VCORE through a plurality of resistance elements R10-R13 and drives the internal voltage VCP/VBLP by comparing a level of a voltage of a node nd10 generated to a half level of the internal power VCORE and a level of the internal voltage VCP/VBLP.

Operation of the internal voltage generation circuit illustrated in FIG. 1 will be described in more detail.

Levels of pull-up driving signal PDRV and pull-down driving signal NDRV are regularly maintained when the level of the internal voltage VCP/VBLP is the half level of the internal power VCORE, i.e., there is no variation, the internal voltage VCP/VBLP is driven by a regular current and is maintained at a regular level.

In this state, if the level of the internal voltage VCP/VBLP is lowered below the voltage of the node nd10, the levels of the pull-up driving signal PDRV and the pull-down driving signal NDRV are gradually decreased and a turn-on degree of a PMOS transistor P16 becomes larger than a turn-on degree of an NMOS transistor N18. Accordingly, the level of the internal voltage VCP/VBLP is increased. Also, if the level of the internal voltage VCP/VBLP is raised above the voltage of the node nd10, the levels of the pull-up driving signal PDRV and the pull-down driving signal NDRV are gradually increased and the turn-on degree of the NMOS transistor N18 becomes larger than the turn-on degree of the PMOS transistor P16. Accordingly, the level of the internal voltage VCP/VBLP is decreased. In other words, the internal voltage generation circuit controls so that the level of the internal voltage VCP/VBLP is generated to a half level of the internal power VCORE.

However, in the conventional internal voltage generation circuit of FIG. 1, a driving force for driving the internal voltage VCP/VBLP is considerably decreased at a low temperature as compared to a high temperature.

Referring to FIG. 2, currents for driving the internal voltage VCP/VBLP (hereinafter, referred to as 'driving current') at a high temperature (90° C.) and a low temperature (−40° C.) when the internal voltage VCP/VBLP is varied from 0.4 V to 0.8 V are compared. That is, at a high temperature (90° C.), the driving current is 1.1 mA if the internal voltage VCP/VBLP is lowered to 0.5 V and the driving current is 2.6 mA if the internal voltage VCP/VBLP is raised to 0.7 V. On the other hand, at a low temperature (−40° C.), the driving current is 0.24 mA if the internal voltage VCP/VBLP is lowered to 0.5 V and the driving current is −0.3 mA if the internal voltage VCP/VBLP is raised to 0.7 V. Here, the driving current is the current supplied through the PMOS transistor P16 and the NMOS transistor N18 to drive the internal voltage VCP/VBLP. The positive (+) driving current means that the internal voltage VCP/VBLP is pulled up as the current supplied through the PMOS transistor P16 is larger than the current discharged through the NMOS transistor N18, and the negative (−) driving current means that the internal voltage VCP/VBLP is pulled down as the current supplied through the PMOS transistor P16 is smaller than the current discharged through the NMOS transistor N18.

As such, since the driving current is considerably decreased at a low temperature (−40° C.) as compared to a high temperature (90° C.), it takes too much time to reset the internal voltage VCP/VBLP with a varied level to a half level of the internal voltage VCORE.

BRIEF SUMMARY

In an aspect of this disclosure, there is provided an internal voltage generation circuit capable of reducing a time taken to reset the internal voltage VCP/VBLP with a varied level to a predetermined level by increasing a driving current at a low temperature.

In an embodiment, an internal voltage generation circuit includes a temperature detection unit which detects an internal temperature of a semiconductor memory device and generates a temperature signal, a driving control signal generation unit which receives the temperature signal and generates first and second driving control signals, and an internal voltage generation unit which receives the first and second driving control signals and generates an internal voltage.

In another embodiment, an internal voltage generation circuit includes a level signal generation unit which voltage-divides an internal power and generates a level signal, a control voltage generation unit which receives the level signal and generates first and second control voltages, a driving signal generation unit which receives the first and second control voltages and generates first and second driving signals, a driving unit which receives the first and second driving signals and drives an internal voltage, and a driving control unit which receives the first and second driving control signals and drives the internal voltage, wherein the first and second driving control signals are the same levels as the first and second driving signals when an internal temperature of a semiconductor memory device is below a preset temperature.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
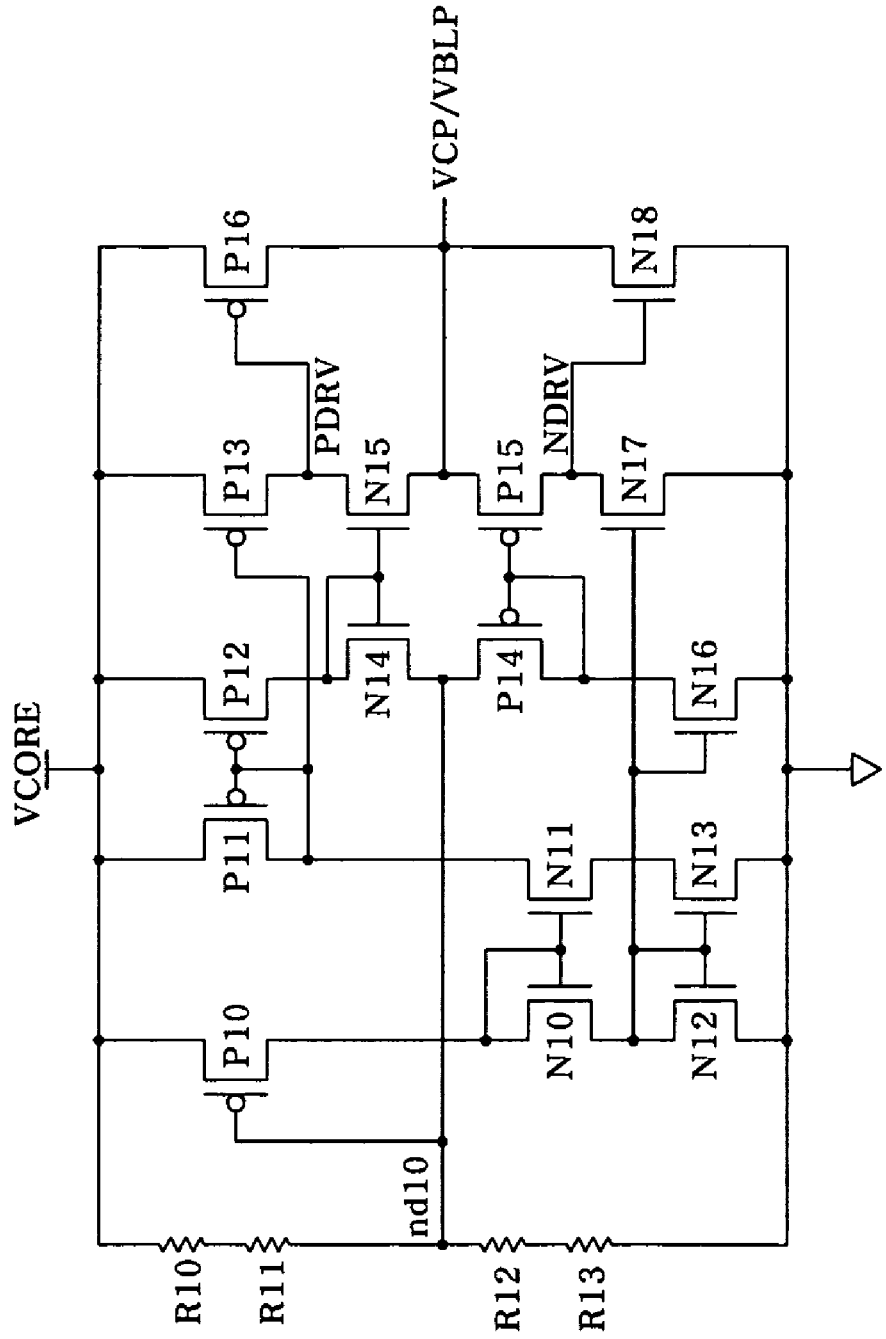
FIG. 1 is a circuit diagram illustrating a conventional internal voltage generation circuit.
Figure 2:
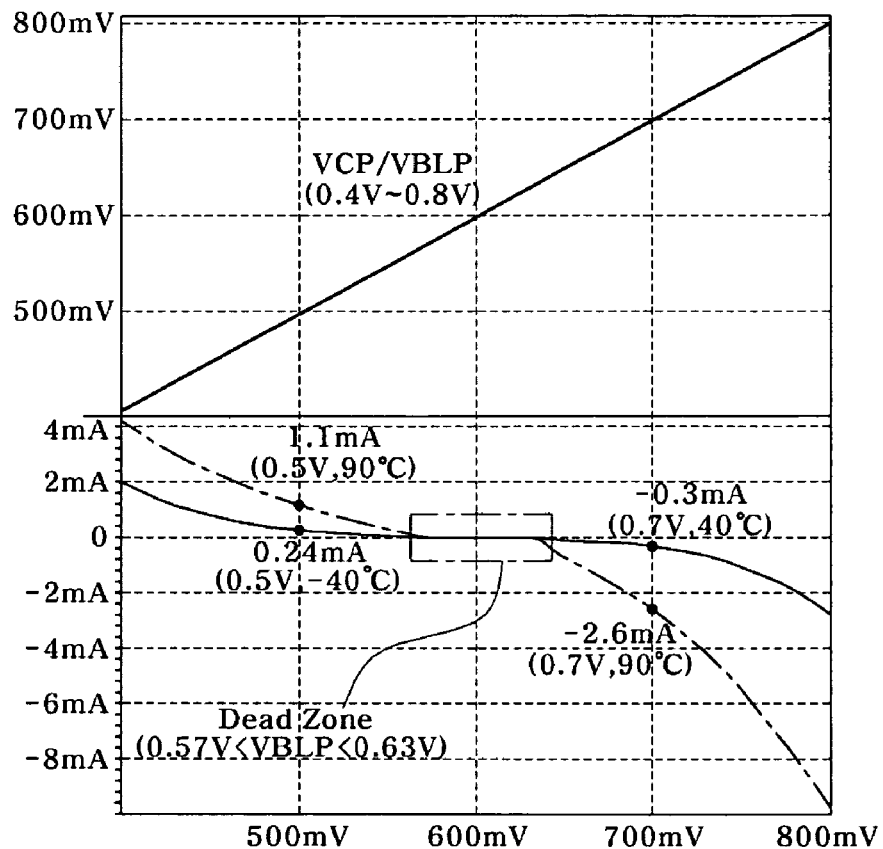
FIG. 2 is a view illustrating variation in a driving current with variation in an internal voltage at different temperatures.
Figure 3:
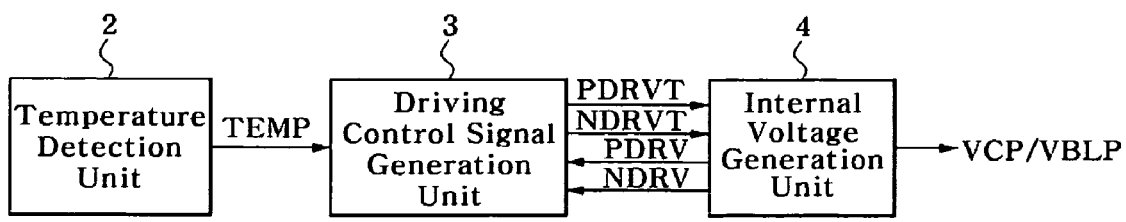
FIG. 3 is a block diagram illustrating a configuration of an internal voltage generation circuit in accordance with an embodiment of the present invention.

FIG. 3 is a block diagram illustrating a configuration of an internal voltage generation circuit in accordance with an embodiment of the present invention.

The internal voltage generation circuit as illustrated in FIG. 3 includes a temperature detection unit 2, a driving control signal generation unit 3 and an internal voltage generation unit 4.

Figure 4:
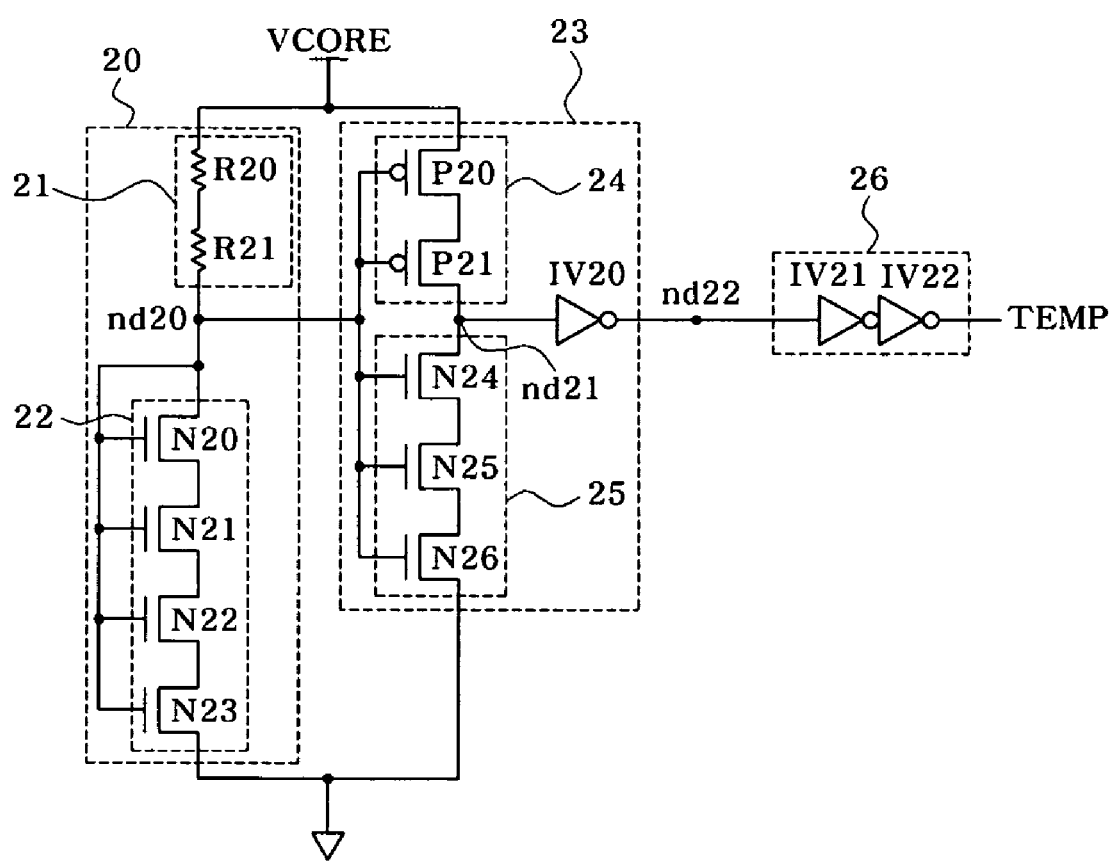
FIG. 4 is a circuit diagram illustrating a temperature detection unit included in the internal voltage generation circuit of FIG. 3.

The temperature detection unit 2 includes, as illustrated in FIG. 4, a voltage dividing unit 20, a level setting unit 23 and a buffer unit 26. The voltage dividing unit 20 includes a first resistor unit 21 consisting of resistance elements R20, R21 serially connected between an internal power VCORE and a node nd20 and a second resistor unit 22 consisting of NMOS transistors N20-N23 serially connected between the node nd20 and a ground voltage VSS. The level setting unit 23 includes a pull-up unit 24 which consists of PMOS transistors P20, P21 serially connected between the internal power VCORE and a node nd21 and pulls up the node nd21 in response to a signal of the node nd20, a pull-down unit 25 which consists of NMOS transistors N24-N26 serially connected between the node nd21 and the ground voltage VSS and an inverter IV20 which inverts the signal of the node nd21 and outputs an inverted signal to node nd22. The buffer unit 26 consists of inverters IV21, IV22, and buffers a signal of the node nd22 and generates a temperature signal TEMP.

The temperature detection unit 2 generates the temperature signal TEMP of a high level when an internal temperature of the semiconductor memory device is below a preset temperature, and generates the temperature signal TEMP of a low level when the internal temperature exceeds the preset temperature.

Figure 5:
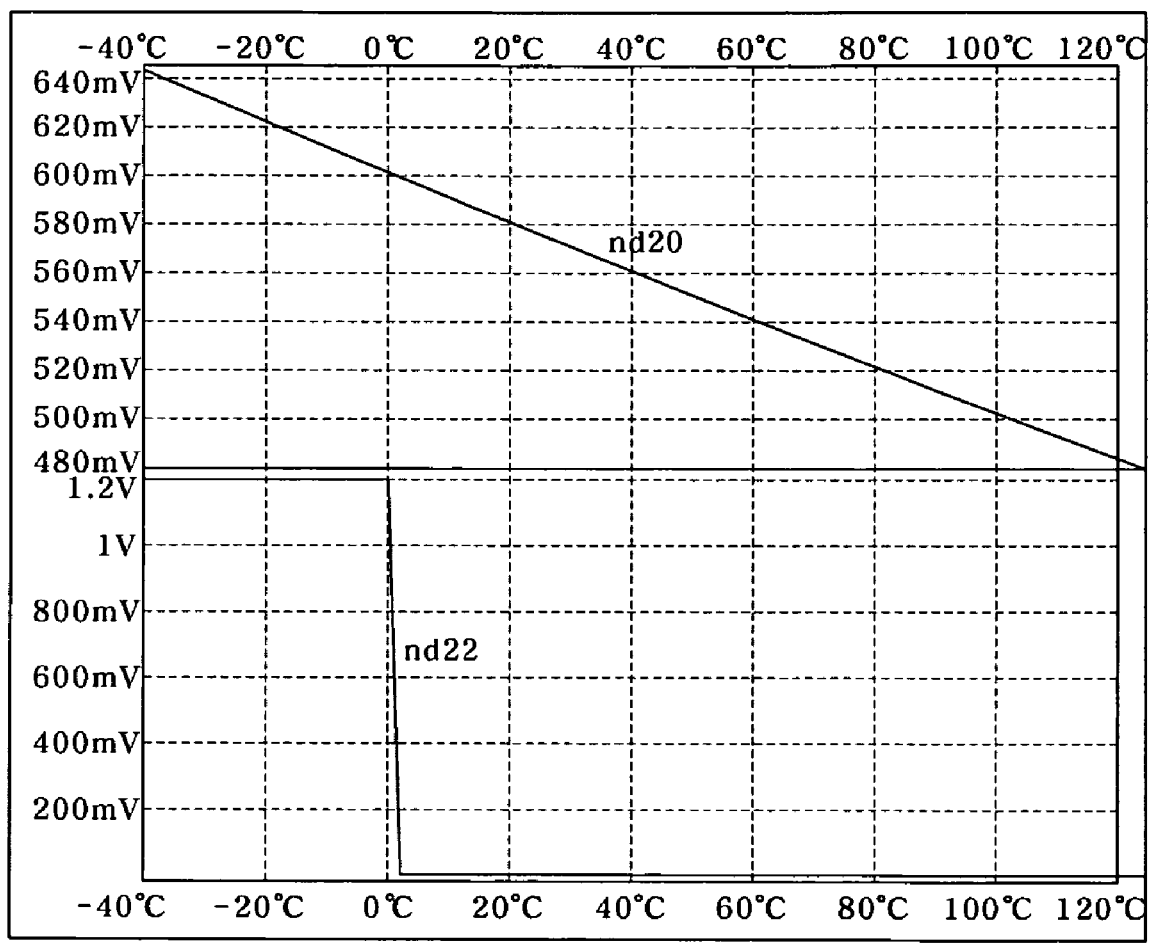
FIG. 5 is a timing diagram illustrating operation of the temperature detection unit of FIG. 4.

Describing operation of the temperature detection unit 2 more specifically with reference to FIG. 5, when the temperature is increases from −40° C. to 120° C., a resistance of the first resistor unit 21 consisting of resistance elements R20, R21 is increased and a resistance of the second resistor unit 22 consisting of NMOS transistors N20-N23 is decreased. Accordingly, the level of the node nd20 is decreased since the current discharged through the second resistor unit 22 is larger. The level of the node nd20 is converted to a digital level through the level setting unit 23 and outputted to the node nd22, and the level of the node nd22 is shifted from a high level to a low level in a period where the internal temperature is 0° C. Therefore, the temperature detection unit 2 generates the temperature signal TEMP, a level of which is shifted on the basis of the internal temperature of 0° C. In other words, the temperature signal TEMP generated in the temperature detection unit 2 is a high level when the internal temperature is below 0° C. and a low level when the internal temperature is more than 0° C.

Figure 6:
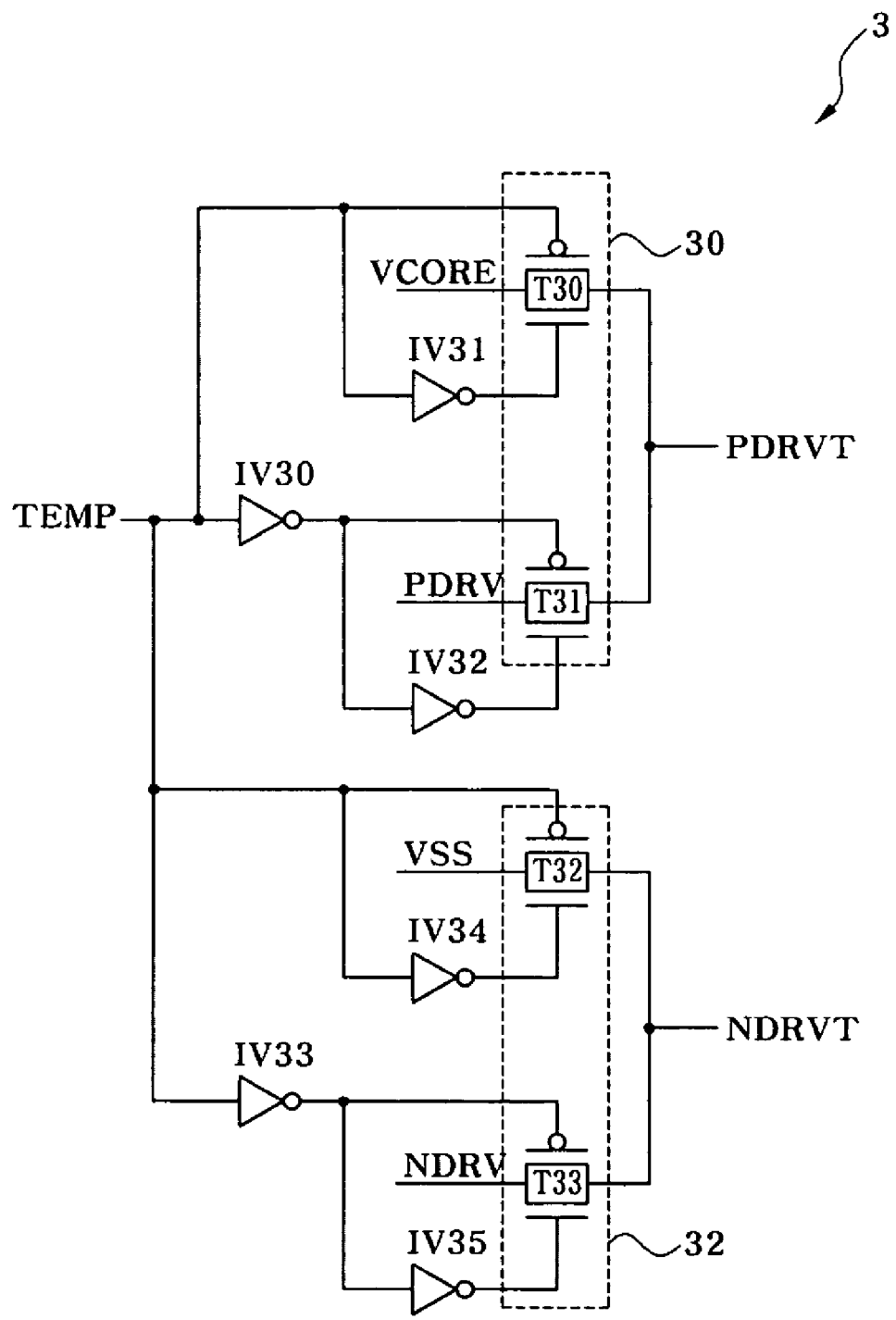
FIG. 6 is a circuit diagram illustrating a driving control signal generation unit included in the internal voltage generation circuit of FIG. 3.

The driving signal generation unit 3 includes, as illustrated in FIG. 6, a first transfer unit 30 and a second transfer unit 32. The first transfer unit 30 includes a first transfer gate T30 transferring the internal power VCORE to a first driving control signal PDRVT in response to the temperature signal TEMP, and a second transfer gate T31 transferring a first driving signal PDRV to the first driving control signal PDRVT in response to the temperature signal TEMP. The second transfer unit 32 includes a third transfer gate T32 transferring the ground voltage VSS to a second driving control signal NDRVT in response to the temperature signal TEMP and a fourth transfer gate T33 transferring a second driving signal NDRV to the second driving control signal NDRVT in response to the temperature signal TEMP.

In the driving control signal generation unit 3 having the configuration as described above, the second transfer gate T31 and the fourth transfer gate T33 are turned on and the first driving signal PDRV is transferred to the first driving control signal PDRVT and the second driving signal NDRV is transferred to the second driving control signal NDRVT when the temperature signal TEMP is at a high level, i.e., the internal temperature is below 0° C. Meanwhile, the first transfer gate T30 and the third transfer gate T32 are turned on and the internal power VCORE is transferred to the first driving control signal PDRVT and the ground voltage VSS is transferred to the second driving control signal NDRVT when the temperature signal TEMP is at a high level, i.e., the internal temperature exceeds 0° C.

Figure 7:
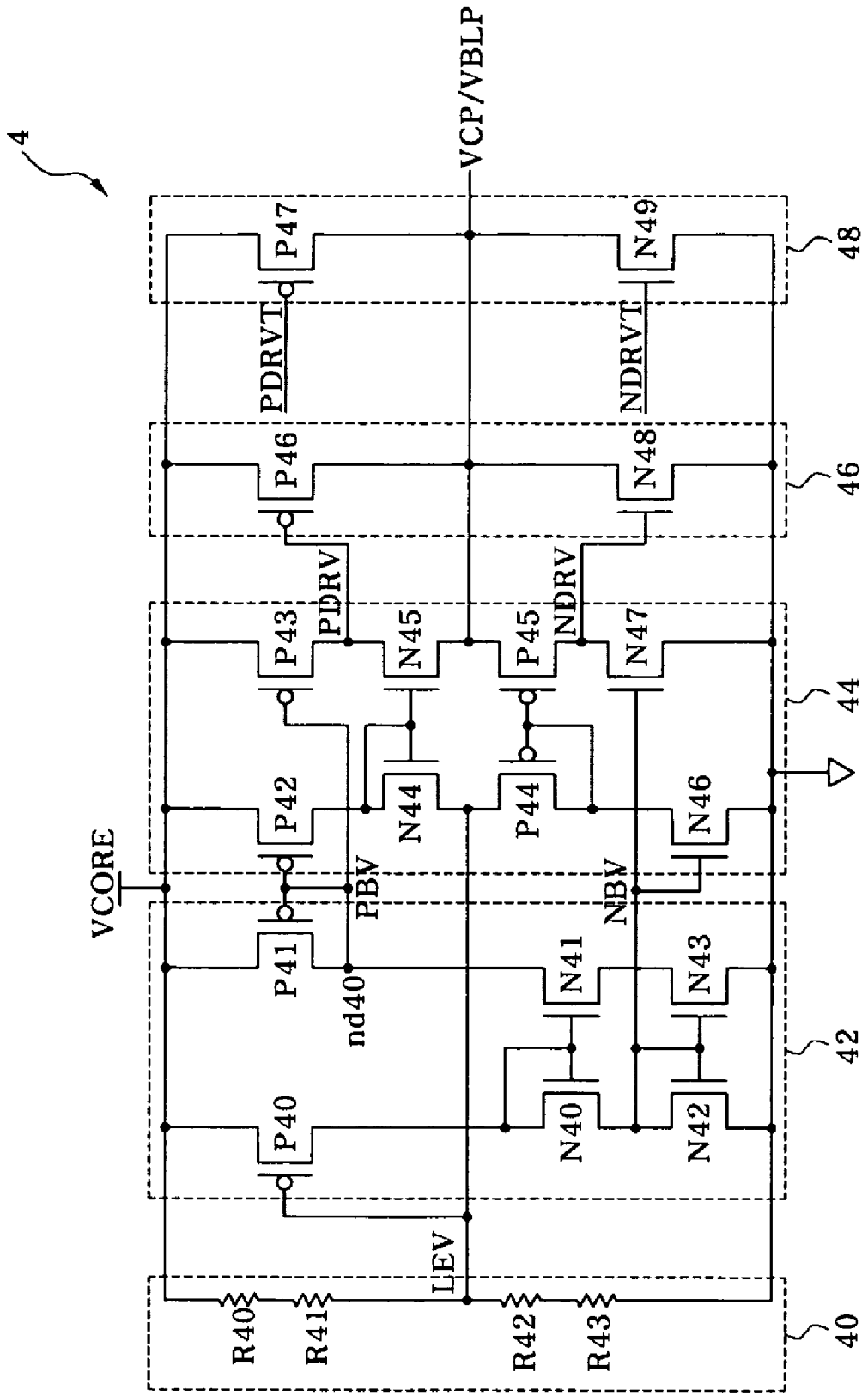
FIG. 7 is circuit diagram illustrating an internal voltage generation unit included in the internal voltage generation circuit of FIG. 3.

The internal voltage generation unit 4 includes, as illustrated in FIG. 7, a level signal generation unit 40, a control voltage generation unit 42, a driving signal generation unit 44, a driving unit 46 and a driving control unit 48.

The level signal generation unit 40 voltage-divides the internal power VCORE and generates a level signal LEV. At this time, sum of resistances of the resistance element R40 and the resistance element R41 and sum of resistances of the resistance element R42 and the resistance element R43 are set equal to each other, and the level signal LEV is thus set to a half level of the internal power VCORE.

The control voltage generation unit 42 includes PMOS transistors P40, P41 and NMOS transistors N40-N43 forming a current mirror, and receives the level signal LEV and generates a first control voltage PBV for controlling current supplied from the internal power VCORE and a second control voltage NBV for controlling current discharged to the ground voltage VSS.

The driving signal generation unit 44 includes PMOS transistors P42, P43 turned on in response to the first control voltage PBV, NMOS transistors N46, N47 turned on in response to the second control voltage NBV, and PMOS transistors P44, P45 and NMOS transistors N44, N45 comparing levels of the level signal LEV and the internal voltage VCP/VBLP and generating the first driving signal PDRV and the second driving signal NDRV. Levels of the first driving signal PDRV and the second driving signal NDRV generated in the driving signal generation unit 44 are decreased when the level of the internal voltage VCP/VBLP becomes smaller than that of the level signal LEV, and are increased when the level of the internal voltage VCP/VBLP becomes larger than that of the level signal LEV.

The driving unit 46 includes a PMOS transistor P46 which is a pull-up device pulling up the internal voltage VCP/VBLP in response to the first driving signal PDRV, and an NMOS transistor N48 which is a pull-down device pulling down the internal voltage VCP/VBLP in response to the second driving signal NDRV. When the level of the internal voltage VCP/VBLP becomes smaller than that of the level signal LEV, a turn-on degree of the PMOS transistor P46 becomes larger than a turn-on degree of the NMOS transistor P48 since the levels of the first driving signal PDRV and the second driving signal NDRV are reduced, and the level of the internal voltage VCP/VBLP is thus increased. On the other hand, when the level of the internal voltage VCP/VBLP becomes larger than that of the level signal LEV, the turn-on degree of the NMOS transistor P48 becomes larger than the turn-on degree of the PMOS transistor P46 since the levels of the first driving signal PDRV and the second driving signal NDRV are increased, and the level of the internal voltage VCP/VBLP is thus reduced.

The driving control unit 48 includes a PMOS transistor P47 which is a pull-up device pulling up the internal voltage VCP/VBLP in response to the first driving control signal PDRVT, and an NMOS transistor N49 which is a pull-down device pulling down the internal voltage VCP/VBLP in response to the second driving control signal NDRVT. When the internal temperature of a semiconductor memory device is below 0° C., the driving control unit 48 is driven in similar manner as the driving unit 46 since the first and second driving control signals PDRVT and NDRVT become the same level as the first and second driving signals PDRV and NDRV, respectively, in response to the temperature signal TEMP of a high level. Therefore, when the internal temperature of a semiconductor memory device is below 0° C., the internal voltage VCP/VBLP is driven not only by the driving unit 46 but also by the driving control unit 48. Accordingly, the driving current driving the internal voltage VCP/VBLP is increased. On the other hand, when the internal temperature of a semiconductor memory device exceeds 0° C., the driving control unit 48 is not driven since the first and second driving control signals PDRVT and NDRVT become the same level as the internal power VCORE and the ground voltage VSS, respectively, in response to the temperature signal TEMP of a low level. Therefore, when the internal temperature of a semiconductor memory device exceeds 0° C., the internal voltage VCP/VBLP is driven only by the driving unit 46.

In brief description, the internal voltage generation circuit in accordance with an embodiment of the present invention drives the internal voltage VCP/VBLP only by the driving unit 46 when the internal temperature exceeds 0° C., and drives the internal voltage VCP/VBLP not only by the driving unit 46 but also by the driving control unit 48 when the internal temperature is below 0° C. As described above, the internal voltage generation circuit in accordance with an embodiment of the present invention shortens the time taken to reset the internal voltage VCP/VBLP with a varied level to the half level of the internal power VCORE by increasing the driving current for driving the internal voltage VCP/VBLP at a low temperature.

Figure 8:
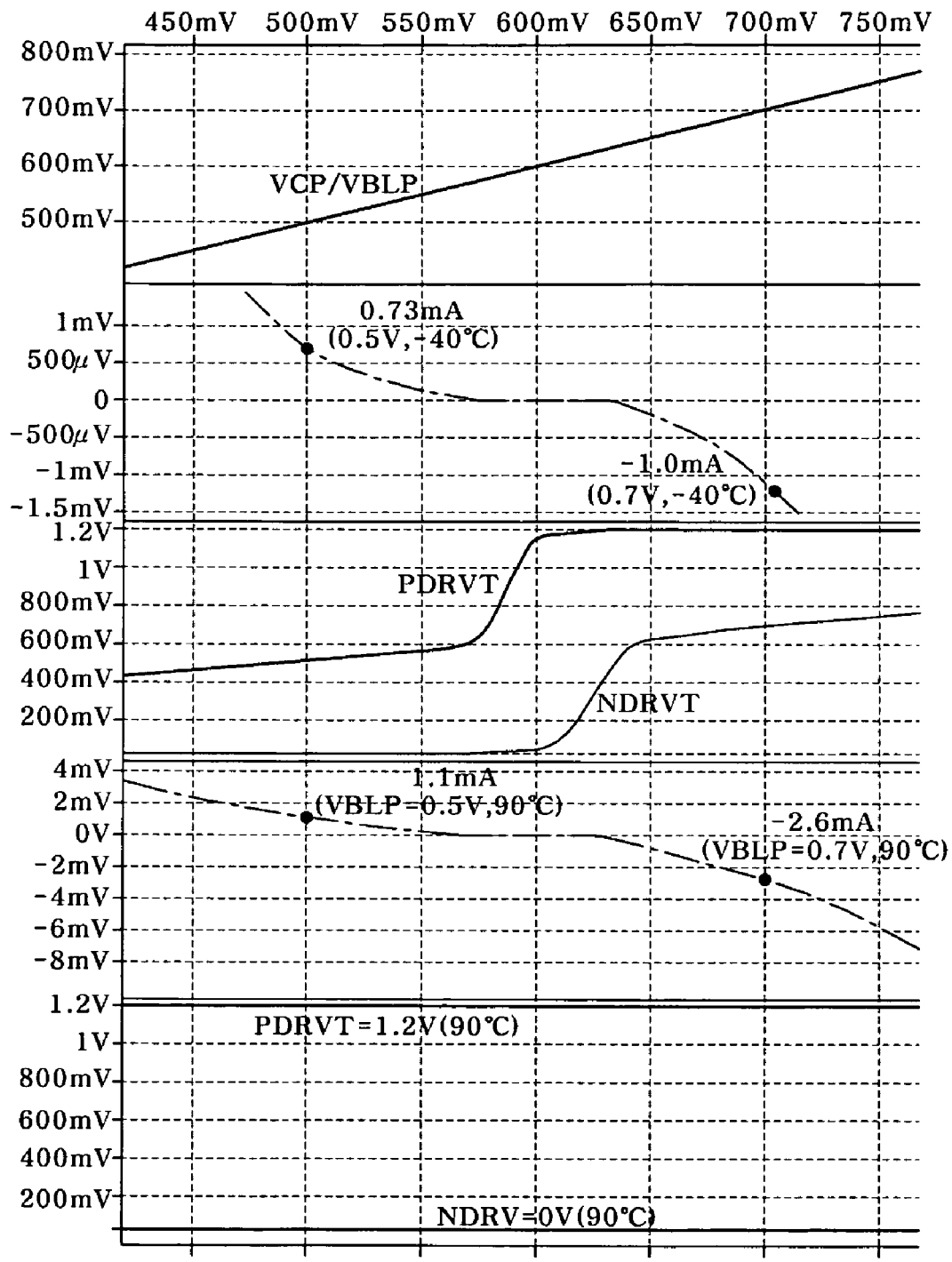
FIG. 8 is a graph illustrating variations in driving current for driving an internal voltage at a high temperature and a low temperature, with the internal voltage varying.

Referring to FIG. 8, variations in the driving current for driving the internal voltage VCP/VBLP at a high temperature (90° C.) and a low temperature (−40° C.) when the internal voltage VCP/VBLP is varied from 0.4 V to 0.8 V are compared. At a high temperature (90° C.), the driving current is 1.1 mA if the internal voltage VCP/VBLP is lowered to 0.5 V and the driving current is 2.6 mA if the internal voltage VCP/VBLP is raised to 0.7 V. This is the same as the conventional art. On the other hand, at a low temperature (−40° C.), the driving current is 0.73 mA if the internal voltage VCP/VBLP is lowered to 0.5 V and the driving current is −1.0 mA if the internal voltage VCP/VBLP is raised to 0.7 V. From this result, it can be appreciated that the driving current is considerably increased at a low temperature as compared to the conventional art.

The internal voltage generation circuit in accordance with an embodiment of the present invention adjusts the driving current driving the internal voltage VCP/VBLP on the basis of a temperature of 0° C. That is to say, internal voltage generation circuit in accordance with an embodiment of the present invention increases the driving current driving the internal voltage VCP/VBLP when the internal temperature of the semiconductor memory device is below 0° C. At this time, the base temperature of 0° C. can be variously set if necessary.

While the present invention has been described with respect to the specific embodiments and examples, it will be apparent to those skilled in the art that various changes and modifications may be made without departing from the spirit and scope of the invention as defined in the following claims.

The present disclosure claims priority to Korean application number 10-2008-0097388, filed on Oct. 2, 2008, which is incorporated herein by reference.

What is claimed is:

1. An internal voltage generation circuit, comprising:
    a temperature detection unit which detects an internal temperature of a semiconductor memory device and generates a temperature signal;
    a driving control signal generation unit which receives the temperature signal and generates first and second driving control signals; and
    an internal voltage generation unit which receives the first and second driving control signals and generates an internal voltage.

2. The internal voltage generation circuit of claim 1, wherein the temperature detection unit generates the temperature signal enabled when the internal temperature is below a preset temperature.

3. The internal voltage generation circuit of claim 2, wherein the temperature detection unit includes:
    a voltage dividing unit which outputs a signal generated by voltage-dividing an internal power to a first node;
    a level setting unit which receives a signal of the first node and sets a level of a second node; and
    a buffer unit which buffers a signal of the second node and generates the temperature signal.

4. The internal voltage generation circuit of claim 3, wherein the voltage dividing unit includes:
    a first resistor unit connected between the internal power and the first node; and
    a second resistor unit connected between the first node and the ground voltage.

5. The internal voltage generation circuit of claim 4, wherein the first resistor unit includes a plurality of serially connected resistance elements.

6. The internal voltage generation circuit of claim 4, wherein the second resistor unit includes a plurality of serially connected MOS transistors.

7. The internal voltage generation circuit of claim 3, wherein the level setting unit includes:
    a pull-up unit which is connected between the internal power and a third node and pulls up the third node in response to the signal of the first node; and a pull-down unit which is connected between the third node and a ground voltage and pulls down the third node in response to the signal of the first node.

8. The internal voltage generation circuit of claim 1, wherein the driving control signal generation unit includes:
   a first transfer unit which selectively outputs an internal power or a first driving signal to the first driving control signal in response to the temperature signal; and
   a second transfer unit which selectively outputs a ground voltage power or a second driving signal to the second driving control signal in response to the temperature signal.

9. The internal voltage generation circuit of claim 8, wherein the first transfer unit includes:
   a first transfer device which transfers the internal power to the first driving control signal in response to the temperature signal; and
   a second transfer device which transfers the first driving signal to the first driving control signal in response to the temperature signal.

10. The internal voltage generation circuit of claim 8, wherein the second transfer unit includes:
    a first transfer device which transfers the ground voltage to the second driving control signal in response to the temperature signal; and
    a second transfer device which transfers the second driving signal to the second driving control signal in response to the temperature signal.

11. The internal voltage generation circuit of claim 1, wherein the internal voltage generation unit includes:
    a level signal generation unit which voltage-divides an internal power and generates a level signal;
    a control voltage generation unit which receives the level signal and generates first and second control voltages;
    a driving signal generation unit which receives the first and second control voltages and generates first and second driving signals;
    a driving unit which receives the first and second driving signals and drives the internal voltage; and
    a driving control unit which receives the first and second driving control signals and drives the internal voltage.

12. The internal voltage generation circuit of claim 11, wherein the driving control unit includes:
    a pull-up device which is connected between the internal power and an output terminal of the internal voltage and pulls up the internal voltage in response to the first driving control signal; and
    a pull-down device which is connected between the output terminal of the internal voltage and a ground voltage and pulls down the internal voltage in response to the second driving control signal.

13. An internal voltage generation circuit, comprising:
    a level signal generation unit which voltage-divides an internal power and generates a level signal;
    a control voltage generation unit which receives the level signal and generates first and second control voltages;
    a driving signal generation unit which receives the first and second control voltages and generates first and second driving signals;
    a driving unit which receives the first and second driving signals and drives an internal voltage; and
    a driving control unit which receives first and second driving control signals and drives the internal voltage,
    wherein the first and second driving control signals are the same levels as the first and second driving signals, respectively, when an internal temperature of a semiconductor memory device is below a preset temperature.

14. The internal voltage generation circuit of claim 13, further comprising: a temperature detection unit which detects the internal temperature of the semiconductor memory device and generates a temperature signal.

15. The internal voltage generation circuit of claim 14, wherein the temperature detection unit generates the temperature signal enabled when the internal temperature is below the preset temperature.

16. The internal voltage generation circuit of claim 14, wherein the temperature detection unit includes:
    a voltage dividing unit which outputs a signal generated by voltage-dividing the internal power to a first node;
    a level setting unit which receives a signal of the first node and sets a level of a second node; and
    a buffer unit which buffers a signal of the second node and generates the temperature signal.

17. The internal voltage generation circuit of claim 16, wherein the voltage dividing unit includes:
    a first resistor unit connected between the internal power and the first node; and
    a second resistor unit connected between the first node and the ground voltage.

18. The internal voltage generation circuit of claim 17, wherein the first resistor unit includes a plurality of serially connected resistance elements.

19. The internal voltage generation circuit of claim 17, wherein the second resistor unit includes a plurality of serially connected MOS transistors.

20. The internal voltage generation circuit of claim 16, wherein the level setting unit includes:
    a pull-up unit which is connected between the internal power and a third node and pulls up the third node in response to the signal of the first node; and
    a pull-down unit which is connected between the third node and a ground voltage and pulls down the third node in response to the signal of the first node.

21. The internal voltage generation circuit of claim 15, further comprising: a driving control signal generation unit which receives the temperature signal and the first and second driving signals, and generates first and second driving control signals.

22. The internal voltage generation circuit of claim 21, wherein the driving control signal generation unit includes:
    a first transfer unit which selectively outputs the internal power or the first driving signal to the first driving control signal in response to the temperature signal; and
    a second transfer unit which selectively outputs a ground voltage power or the second driving signal to the second driving control signal in response to the temperature signal.

23. The internal voltage generation circuit of claim 22, wherein the first transfer unit includes:
    a first transfer device which transfers the internal power to the first driving control signal in response to the temperature signal; and
    a second transfer device which transfers the first driving signal to the first driving control signal in response to the temperature signal.

24. The internal voltage generation circuit of claim 22, wherein the second transfer unit includes:
    a first transfer device which transfers the ground voltage to the second driving control signal in response to the temperature signal; and
    a second transfer device which transfers the second driving signal to the second driving control signal in response to the temperature signal.

* * * * *